(12) United States Patent
Reinschmidt et al.

(10) Patent No.: US 7,120,884 B2
(45) Date of Patent: Oct. 10, 2006

(54) MASK REVISION ID CODE CIRCUIT

(75) Inventors: Robert M. Reinschmidt, Hollis, NH (US); Ronald W. Choi, Somerville, MA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1294 days.

(21) Appl. No.: 09/751,429

(22) Filed: Dec. 29, 2000

(65) Prior Publication Data

US 2002/0084331 A1 Jul. 4, 2002

(51) Int. Cl.
- G06F 17/50 (2006.01)
- G06F 19/00 (2006.01)
- H01L 23/485 (2006.01)
- H01L 23/528 (2006.01)

(52) U.S. Cl. .............. 716/9; 716/10; 716/13; 716/14; 716/19; 700/115; 257/758

(58) Field of Classification Search .......... 716/9, 716/10, 13, 14, 19, 21; 700/115, 221, 226; 326/41, 47, 101; 257/758
See application file for complete search history.

(56) References Cited

U.S. PATENT DOCUMENTS

| | | | | |
|---|---|---|---|---|
| 5,059,942 A | * | 10/1991 | Burrows | 340/146.2 |
| 5,399,505 A | * | 3/1995 | Dasse et al. | 438/17 |
| 5,787,012 A | * | 7/1998 | Levitt | 716/1 |
| 5,895,962 A | * | 4/1999 | Zheng et al. | 257/529 |
| 6,292,024 B1 | * | 9/2001 | Jensen et al. | 326/47 |
| 6,351,684 B1 | * | 2/2002 | Shirley et al. | 700/121 |
| 6,365,421 B1 | * | 4/2002 | Debenham et al. | 438/14 |
| 6,496,035 B1 | * | 12/2002 | Jensen et al. | 326/47 |
| 6,514,780 B1 | * | 2/2003 | Manyoki | 438/18 |
| 6,530,074 B1 | * | 3/2003 | Genetti et al. | 716/19 |
| 6,629,239 B1 | * | 9/2003 | Steele, Jr. | 712/300 |
| 6,798,067 B1 | * | 9/2004 | Hesse | 257/758 |
| 2001/0011909 A1 | * | 8/2001 | Jensen et al. | 326/47 |

(Continued)

FOREIGN PATENT DOCUMENTS

JP  62235952 A  * 10/1987

(Continued)

*Primary Examiner*—Phallaka Kik
(74) *Attorney, Agent, or Firm*—Bradley T. Sako

(57) ABSTRACT

A mask identification (ID) bit circuit (100) is disclosed that provides one of two potentials (VGND or VPWR) to a sense node (108). A mask ID bit circuit (100) may include a number of links (102-0 to 102-4) arranged in series. A link (102-0 to 102-4) may include inputs (104-0 and 104-1) and outputs (106-0 and 106-1). In one configuration, inputs (104-0 and 104-1) may be directly coupled to outputs (106-0 and 106-1). In another configuration, inputs (104-0 and 104-1) may be cross coupled to outputs (106-0 and 106-1). Cross coupling inputs (104-0 and 104-1) and outputs (106-0 and 106-1) of a link (102-0 to 102-4) can switch a potential (VGND or VPWR) supplied to a sense node (108). The configuration of more than one link (102-0 to 102-4) of a mask ID bit circuit (100) can be changed, allowing a sense node to be switched between two potential (VGND and VPWR) multiple times. According to an embodiment, n mask ID bit circuits (100) may provide as many as $2^n$ different mask ID codes.

21 Claims, 4 Drawing Sheets

U.S. PATENT DOCUMENTS

| | | | |
|---|---|---|---|
| 2001/0013658 A1* | 8/2001 | Manyoki | 257/758 |
| 2002/0006676 A1* | 1/2002 | Debenham et al. | 438/14 |
| 2003/0126581 A1* | 7/2003 | Pang et al. | 716/19 |
| 2003/0177468 A1* | 9/2003 | Genetti et al. | 716/19 |
| 2004/0036084 A1* | 2/2004 | Zimmermann et al. | 257/200 |

FOREIGN PATENT DOCUMENTS

| | | | |
|---|---|---|---|
| JP | 03156543 A | * | 7/1991 |
| JP | 04153872 A | * | 5/1992 |
| JP | 11224278 A | * | 8/1999 |

* cited by examiner

US 7,120,884 B2

MASK REVISION ID CODE CIRCUIT

TECHNICAL FIELD

The present invention relates generally to integrated circuits, and more particularly to circuits for indicating mask versions and/or revisions of an integrated circuit.

BACKGROUND OF THE INVENTION

A typical integrated circuit may be formed by patterning or otherwise altering various layers according to particular masks. A collection of masks for forming an integrated circuit is often referred to as a mask set. An integrated circuit mask may take various forms. As one example, a mask may be a lithographic mask for selectively exposing a resist material to a radiation source, such as light having a particular frequency. In addition or alternatively, a mask may include a pattern that is programmed into a machine that may provide a beam of particles, such as electrons. Such a beam may raster a pattern across an integrated circuit layer according to such a programmed pattern.

While one particular mask set can be used in the production of an integrated circuit, such as mask set may be revised as changes to a device are made. In many cases, a mask revision may not substantially change the overall operation of an integrated circuit. Thus, it may not be possible to determine which particular mask set was used to fabricate an integrated circuit without deprocessing the device. Deprocessing can be time consuming, involve the use of various noxious chemicals, and can render a device non-operational.

At the same time, it is desirable to know the particular mask set for a device for reliability and other tracking reasons. Accordingly, in order to identify a mask set for an integrated circuit without having to resort to deprocessing, many integrated circuits include readable mask revision identification (ID) codes. By electronically reading values generated at a particular pin, or pins, it can be possible to identify a particular mask set.

One conventional approach to generating mask revision ID codes will now be described with reference to a number of diagrams.

Referring now to FIG. 7, a mask revision ID code circuit is shown in a block diagram and designated by the general reference character 700. A circuit 700 may include a number of mask ID bit circuits 702-0 to 702-n, where n is an integer. Each mask ID bit circuit (702-0 to 702-n) may receive two different voltages as inputs: VGND and VPWR. Such input voltages may be power supply voltages, as but one example. Each mask ID bit circuit (702-0 to 702-n) may also provide an output value SA0 to SAn. Output values (SA0 to SAn) may provide a mask revision ID code. Thus, mask ID bit circuits (702-0 to 702-n) may be configured so that each different mask revision can result in a different set of output values (SA0 to SAn).

FIG. 8 illustrates one example of a conventional mask ID bit circuit 800. A mask ID bit circuit 800 may include a number of links, shown as 802-0 to 802-4, arranged in series. Each link (802-0 to 802-4) may be formed from a different layer of an integrated circuit. As but one example, a link 802-0 may be formed from a layer comprising amorphous and/or polycrystalline silicon (polysilicon), while links 802-1 to 802-4 may be formed from increasingly higher levels of interconnect. That is, link 802-1 may be formed from a "metal 1" layer, link 802-2 may be formed from a "metal 2" layer, etc. An output value SAn may be provided at a sense node 804.

In FIG. 8, each link is represented as a double throw switch. In this way, a sense node may be connected to either a first potential (VGND) or a second potential (VPWR) according to the arrangements of the links.

Examples of conventional links are shown in FIG. 9. FIG. 9 includes a series of top plan views of links, starting with a lower integrated circuit layer link 802-0 and ending with a higher integrated circuit layer link 802-4. It is understood that each layer may be electrically connected with one another by way of a vertical contact and/or via. Such electrical connections between layers are shown as dashed lines in FIG. 9.

In the conventional approach of FIG. 9, each link (802-0 to 802-4) may include conductive lines 902-00/01 to 902-40/41. Each conductive line (902-00 to 902-41) may include a downward contact 904-00/01 to 904-40/41 and an upward contact 906-00/01 to 906-40/41. It is understood that a downward contact (904-00 to 904-41) may connect one layer with a lower layer. Similarly an upward contact (906-00 to 906-41) may connect one layer with a higher layer. For example, in the particular arrangement of FIG. 9, downward contacts 904-10 and 904-11 can correspond to upward contacts 906-00 and 906-01.

In FIG. 9, conductive line 902-00 may have a downward contact 904-00 to one potential (VGND), while conductive line 902-01 may have a downward contact 904-10 to another potential (VPWR). Further, in the example of FIG. 9, a conductive line 902-40 may provide an output value SAn at a sense node 804.

To better understand vertical connections between layers, a side cross sectional view is presented in FIG. 10. FIG. 10 shows a potential VGND connected to conductive line 902-00 by way of downward contact 904-00. Various connections between conductive lines 902-00, 902-10 and 902-20 are shown in the cross sectional view.

It is noted that the arrangement of FIGS. 8 and 9 can represent a mask bit ID circuit in an initial (unmodified) state. That is, such a mask bit ID circuit may represent an initial set of masks for an integrated circuit. In an unmodified state, an output value SAn will be low (e.g., VGND), as the series of links (802-0 to 802-4) provide a conductive path between VGND and a sense node 804. As a mask is revised, a change may also be made in the mask bit ID circuit to change the output value SAn provided by such a circuit. A revised mask bit ID circuit is shown in FIGS. 11 and 12.

In FIG. 11, a link 1102-2 has been modified to reflect a change in a mask set. As a result, if a link 1102-2 can be conceptualized as a double throw switch, once modified, the switch can be considered to be thrown to connect to a potential VPWR, rather than a potential VGND (the unmodified state). Once such a change is made, an output value SAn can be a logic high value, as a modified conductive path is created between a potential VPWR and a sense node 804.

FIG. 12 shows top plan views corresponding to the various links of FIG. 11. As shown, a modified link 1102-2 may include one conductive line 1202-20 that includes a single downward contact 904-20, and another conductive line 1202-21 that includes a single downward contact 904-21, but conductively connects to a higher link with upward contacts 906-20 and 906-21. In this way, a low logic value (VGND) can be isolated from a sense node 804, while a high logic value (VPWR) can be redirected to a sense node 804, thereby indicating a mask change/revision.

A drawback to conventional approaches, such as that described above, can be the limited number of mask revisions that may be expressed for a given set of mask bit ID circuits. In particular, for n mask ID bits, only n mask revisions may be expressed. Such a limitation can exist because once a change is made to a mask ID bit, the bit value may not be changed back unless the same mask layer is changed. Consequently, to account for higher numbers of mask revisions, it may be necessary to include more and more mask ID bit circuits.

It would be desirable to arrive at some way of providing a mask ID code circuit that can allow for an increased number of possible mask revision codes for a given number of mask ID bit circuits than conventional approaches. It would also be desirable that such a solution does not substantially increase the overall area required for such a mask ID code circuit.

SUMMARY OF THE INVENTION

According to one embodiment of the present invention, a mask identification circuit may include n mask ID bit circuits that provide an n-bit mask ID code. Unlike conventional approaches, an n-bit ID code according to the embodiments can provide $2^n$ different mask ID codes with any combination of mask layer changes. Consequently, more mask changes may be accommodated than conventional approaches.

According to one aspect of the embodiments, each mask ID bit circuit may include signal paths connected to two different potentials. In one mask version, a mask ID bit circuit provides a first potential to a sense node. In another mask version, signal paths may be cross coupled to provide a second potential to a sense node. In yet another mask version, signal paths maybe cross coupled once again to provide the first potential to a sense node once again.

According to another aspect of the embodiments, each mask ID bit circuit may include a number of links arranged in series. Each link can include two inputs and two outputs. In a first configuration, two inputs may be directly coupled to two outputs, while in a second configuration, two inputs may be cross coupled to two outputs.

According to another aspect of the embodiments, a link may include two conductive lines. In a first configuration, two conductive lines may have a first orientation. In a second configuration, two conductive lines may have a different orientation. Different orientations may be perpendicular to one another.

According to another aspect of the embodiments, a conductive line of a link may be connected to a conductive line of another link by one contact in both a first configuration and a second configuration.

According to another aspect of the embodiments, each link may be connected to a lower link by downward contacts that are diagonal to one another. Further, each link may be connected to a higher link by upward contacts that are diagonal to one another.

DETAILED DESCRIPTION OF THE EMBODIMENTS

Various embodiments of the present invention will now be described with reference to a number of diagrams. The embodiments include a mask identification (ID) code circuit and a mask ID bit circuit. According to one embodiment, a mask ID bit circuit may represent more than one change in a mask. Consequently, the number of revisions represented by a mask revision ID code circuit may not be limited to the number of mask ID bit circuits.

Figure 7:
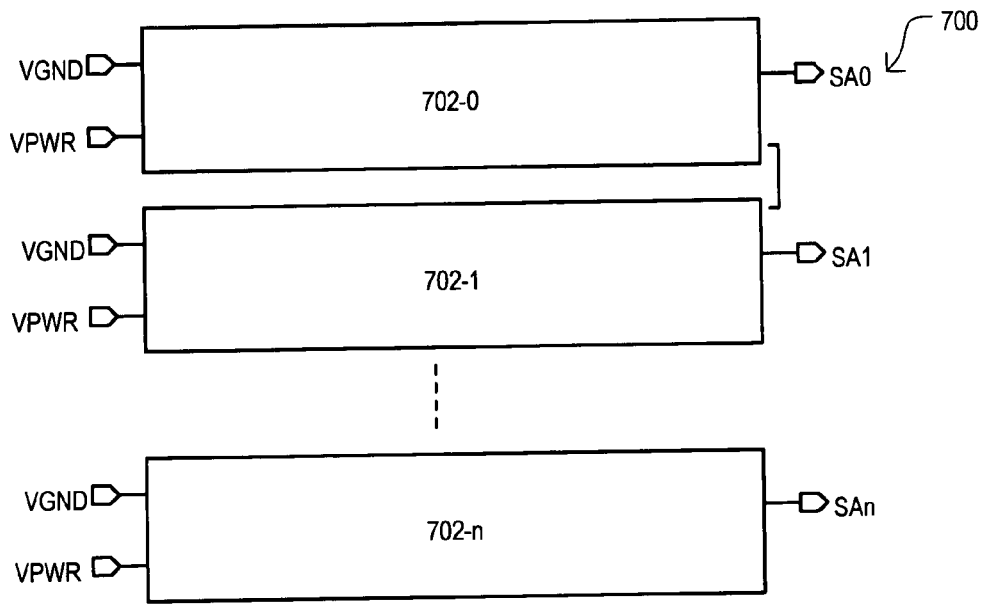
FIG. 7 is a block diagram of a mask revision ID code circuit.
Figure 8:
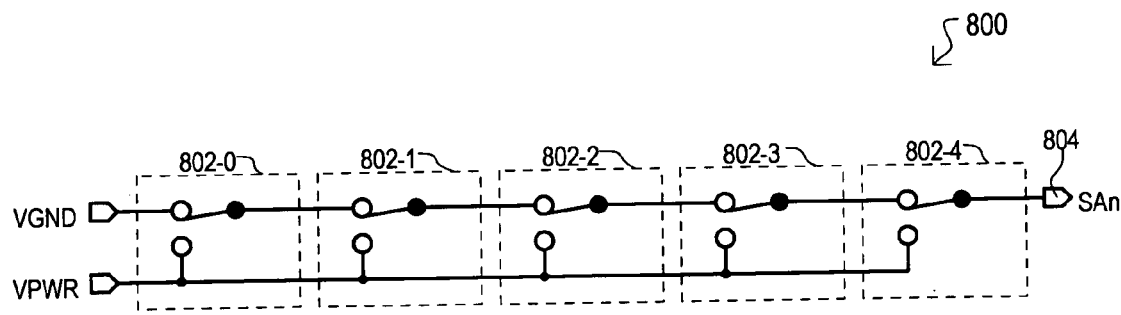
FIG. 8 is a schematic diagram of a conventional mask ID bit circuit.

In one arrangement, a mask revision ID code circuit may have the same general layout as that set forth in FIG. 7. However, unlike conventional approaches, each mask ID bit circuits within such a circuit 700 may be capable representing multiple changes in a mask.

Figure 1:
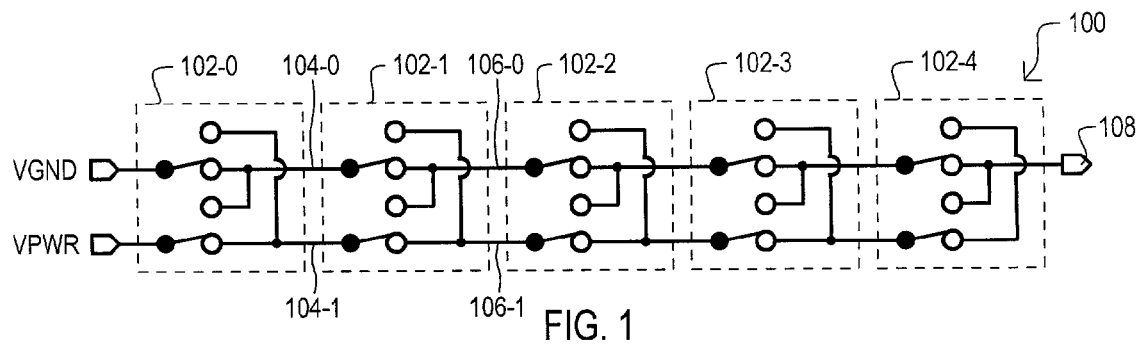
FIG. 1 is a schematic diagram of a mask identification (ID) bit circuit according to one embodiment.

Referring now to FIG. 1, a mask ID bit circuit 100 according to one embodiment is shown in a schematic diagram. A mask ID bit circuit 100 may be conceptualized as including a number of links, shown as 102-0 to 102-4, arranged in series. In one approach, each link (102-0 to 102-4) may be formed from a different layer in an integrated circuit. More particularly, each link may be formed by patterning a different conductive layer. As but one example, one or more lower layers, such as 102-0, may comprise polycrystalline silicon, while one or more higher layers may comprise higher levels of interconnect, or the like.

A link (102-0 to 102-4) may have two inputs and at least one output. For example, in FIG. 1, a link 102-1 may have inputs 104-0 and 104-1 and outputs 106-0 and 106-1. Inputs (104-0 and 104-1) and outputs (106-0 and 106-1) may be directly coupled or cross-coupled. In a directly coupled case, an input 104-0 may be coupled to an output 106-0, while an input 104-1 may be coupled to an output 106-1. In a cross coupled case, an input 104-0 may be coupled to an output 106-1, while an input 104-1 may be coupled to an output 106-0.

FIG. 1 shows an example where links (102-0 to 102-4) can be considered to have directly coupled inputs and outputs. As will be described in more detail below, to indicate a mask change/revision, a link (102-0 to 102-4) may be changed from a directly coupled configuration to a cross coupled configuration, thereby indicating a mask revision/change. Still further, to indicate another mask change/revision, another link (102-0 to 102-4) may be changed from a directly coupled configuration to a cross coupled configuration.

In this way, links (102-0 to 102-4) of a mask ID bit circuit 100 may form signal chains that can provide a particular predetermined potential to a sense node 108. In the example of FIG. 1, a signal chain may provide a conductive path from a potential VGND to a sense node 108. However, if a link is changed into a cross coupled configuration, a signal chain may provide a conductive path from a potential VPWR to a sense node 108. Still further, if another link is changed to a cross coupled configuration, a signal path would switch once more, again providing a conductive path from a potential VGND to a sense node 108. In this way, a mask ID bit circuit 100 may represent more than one change in a mask.

In the embodiment of FIG. 1, a link (102-0 to 102-4) may be conceptualized as including two double throw switches. When both switches are in one state, a link (102-0 to 102-4) may provide direct coupling between an input and output. When both switches are in another state, a link (102-0 to 102-4) may provide cross coupling between an input and an output.

Figure 2:
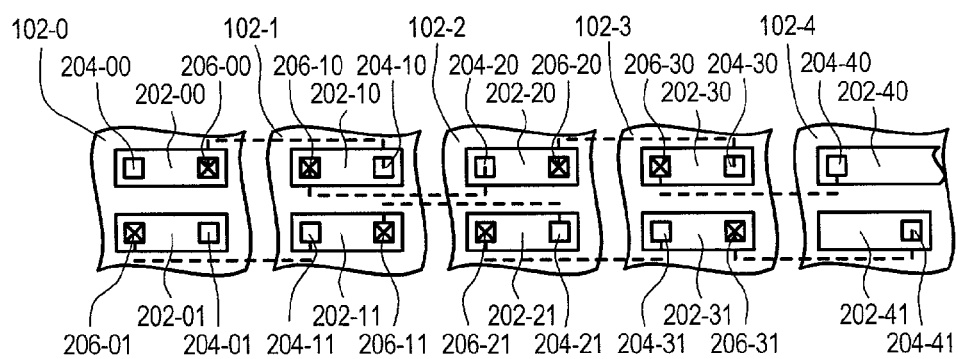
FIG. 2 is a series of top plan views of showing a mask ID bit circuit according to one embodiment.

Referring now to FIG. 2, a series of top plan views of links (102-0 to 102-4) according to one embodiment are shown. Each link (102-0 to 102-4) may be formed on a particular integrated circuit layer, and connected to another link by way of vertical connections. Such vertical connections may include, without limitation, contact like structures, including vias. For example, a link 102-0 may be formed on a lower integrated circuit layer than links 102-1 to 102-4, while a link 102-1 may be formed on a lower integrated circuit layer than links 102-2 to 102-4.

Electrical connections between layers are shown as dashed lines in FIG. 2.

According to the embodiment of FIG. 2, a link (102-0 to 102-4) may include conductive lines 202-00/01 to 202-40/41. Further, a conductive line (202-00 to 202-41) may include a downward contact 204-00/01 to 204-40/41 and an upward contact 206-00/01 to 206-40/41.

Figure 9:
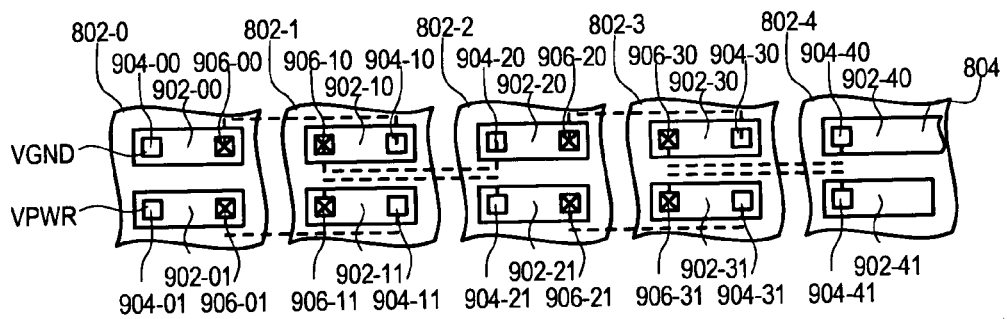
FIG. 9 is a series of top plan views of showing a conventional mask ID bit circuit.
Figure 10:
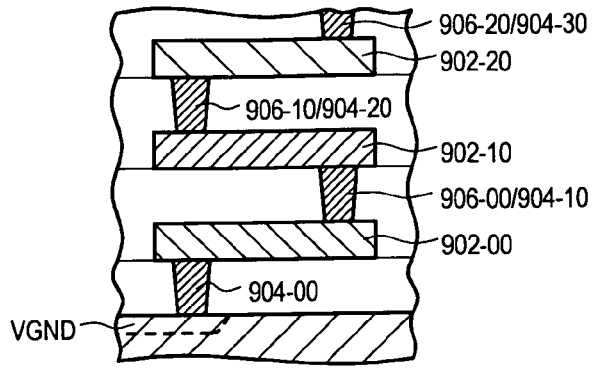
FIG. 10 is a side cross sectional view of a conventional mask ID bit circuit.
Figure 11:
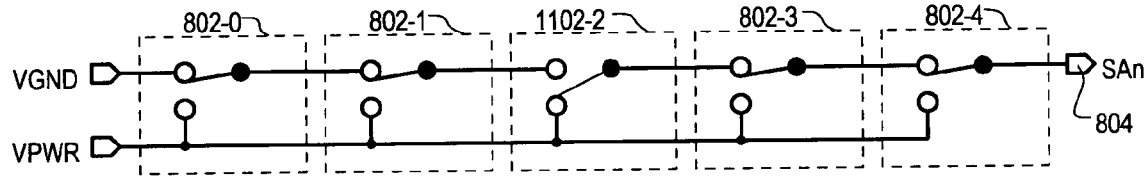
FIG. 11 is a schematic diagram of a conventional mask ID bit circuit after a modification.
Figure 12:
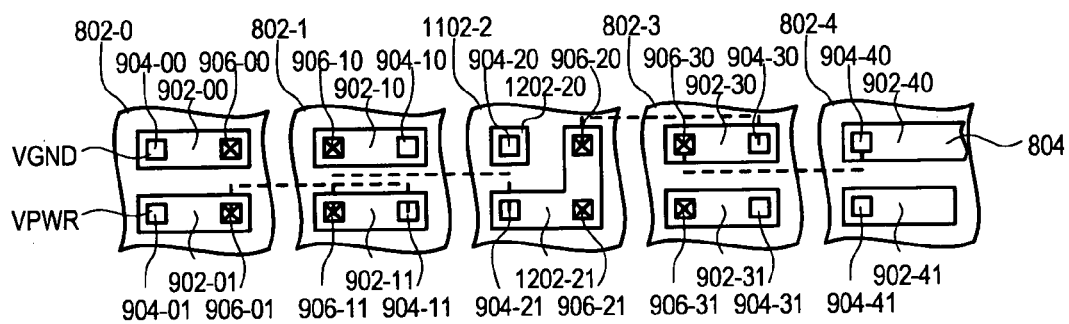
FIG. 12 is a series of top plan views of showing a conventional mask ID bit circuit after a modification.

It is noted that in the example of FIG. 2, downward contacts (204-00 to 204-41) and upward contacts (206-00 to 206-41) have an alternating diagonal relationship to one another. For example, in link 102-0 downward contacts 204-00 and 204-01 are situated diagonal to one another. Similarly, upward contacts 206-00 and 206-01 are diagonal with one another. In a next higher link 102-1, upward contacts 206-10 and 206-11 are diagonal to one another, but situated in an alternating position to downward contacts 206-00 and 206-01 of a lower link 102-0. This is in contrast to a conventional approach, such as that shown in FIG. 9, which may not include contacts in a diagonal arrangement.

An upward contact (206-00 to 206-41) may correspond to a downward contact (204-00 to 204-41) of a next higher layer. For example, in the particular arrangement of FIG. 2, upward contacts 206-00 and 206-01 can correspond to downward contacts 204-10 and 204-11.

In this way, links providing signal paths that may be directly or cross coupled, can be formed on different layers of an integrated circuit.

Figure 3:
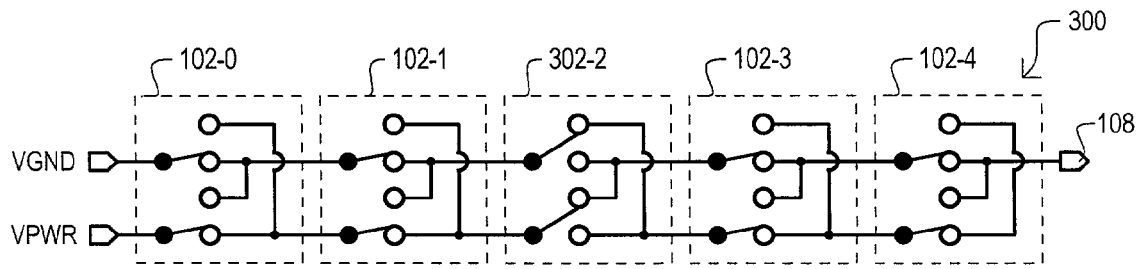
FIG. 3 is a schematic diagram of a mask ID bit circuit after a first modification according to one embodiment.
Figure 4:
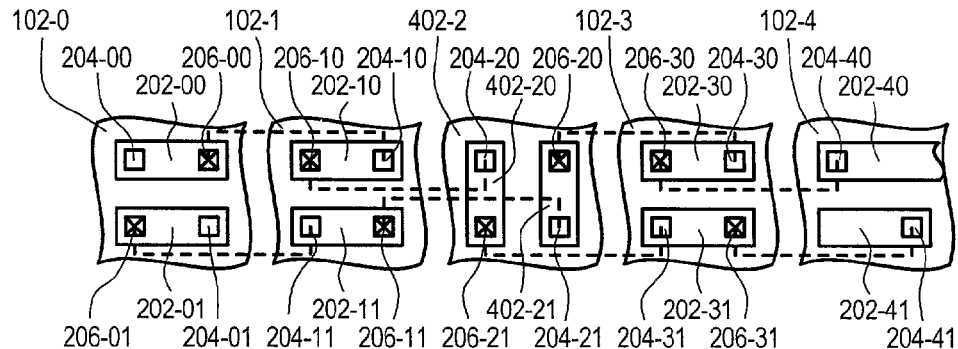
FIG. 4 is a series of top plan views of showing a mask ID bit circuit after a first modification according to one embodiment.

As noted above, the example of FIGS. 1 and 2 shows an example of a links that are directly coupled. FIGS. 3 and 4 show how a link may be changed from a directly coupled state to a cross coupled state, to thereby provide a different value at a sense node 108.

FIG. 3 shows a schematic diagram of a mask ID bit circuit 300 that may include some of the same general constituents as FIG. 1. To that extent like items will be referred to the same reference character as FIG. 1.

FIG. 3 shows links arranged in the same general fashion as FIG. 1. However, unlike FIG. 1, a link 302-2 has been changed to a cross coupled state. In such a state, a signal path can be provided between a potential VPWR and a sense node 108. This is in contrast to the configuration of FIG. 1, which may provide a signal path between a potential VGND and a sense node 108.

As noted above, a cross coupled state may be represented by two, double throw switches being changed from a first thrown position to second thrown position.

FIG. 4 shows a series of top plan views showing links formed in various integrated circuit layers. FIG. 4 can correspond to the arrangement of FIG. 3. Further, FIG. 4 may include some of the same general constituents as FIG. 2. To that extent like items will be referred to the same reference character as FIG. 2.

FIG. 4 shows links arranged in the same general fashion as FIG. 2. However, unlike FIG. 2, a link 402-2 may include conductive lines 402-20 and 402-21 at a different orientation than in a previous mask version. For example, in FIG. 2, which may represent another mask version, a link 102-2 includes conductive lines 102-20 and 102-21 oriented in a first direction (horizontal in the figure). In contrast, in FIG. 4, a link 402-2 may include conductive lines 402-20 and 402-21 oriented in a second direction (vertical in the figure).

A comparison of FIGS. 1, 2 and 3, 4 shows a different value (i.e., the value at sense node 108) may be provided to represent one mask change. However, as noted above, according to the present invention, a mask ID bit circuit may be switched between output values multiple times with multiple mask layers. To illustrate such a capability, a second mask version is shown by FIGS. 5 and 6.

Figure 5:
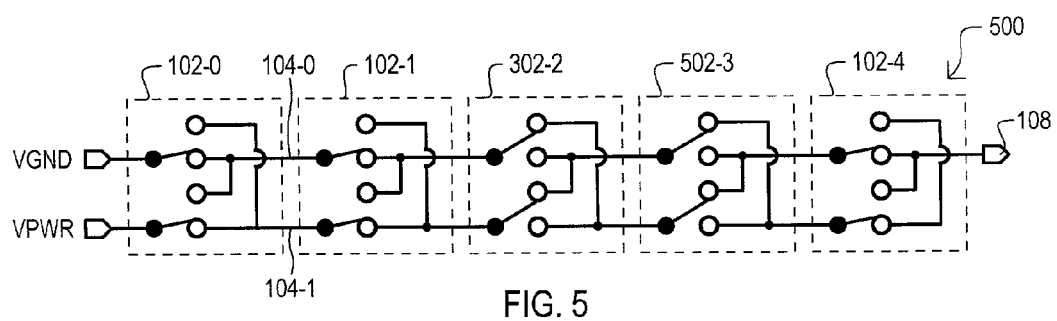
FIG. 5 is a schematic diagram of a mask ID bit circuit after a second modification according to one embodiment.
Figure 6:
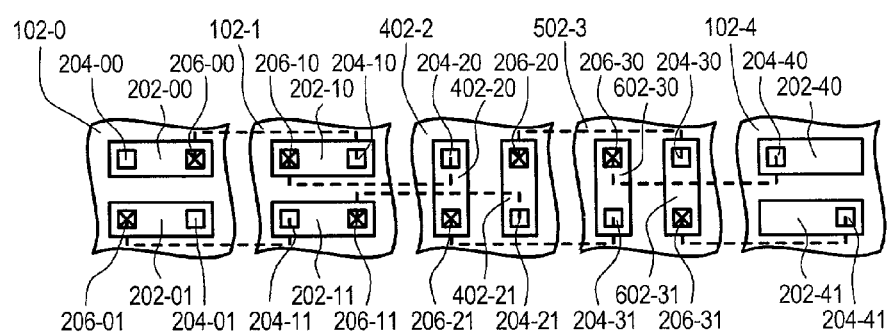
FIG. 6 is a series of top plan views of showing a mask ID bit circuit after a second modification according to one embodiment.

FIGS. 5 and 6 can be conceptualized as showing another mask version change following that of FIGS. 3 and 4. More particularly, FIG. 5 shows a mask ID bit circuit 500 in which another link 502-3 (in addition to a link 302-2) has been placed into a cross coupled state. As in the case of FIG. 3, a link 502-3 in a cross coupled state may be represented by two, double throw switches being switched from a directly coupled thrown position, to a cross coupled thrown position.

As shown in FIG. 5, due to a first cross coupling introduced by a link 302-2 and a second cross coupling introduced by a link 502-3, a signal path can be provided between a sense node 108 and a potential VGND. In this way, in one arrangement (that of FIG. 1), a signal path may be provided from a sense node 108 to a potential VGND. After a first modification (that of FIG. 3), a signal path may be provided from a sense node 108 to a potential VPWR. Then, after a second modification (that of FIG. 5), a signal path may once again be provided from a sense mode 108 to a potential VGND. Thus, a mask ID bit circuit according the various embodiments illustrated by FIGS. 1, 3, 5 may alternate a resulting potential at a sense node as many times as there are links. That is, a potential at node 108 can be changed to the opposite state by changing any link.

FIG. 6 shows a series of top plan views showing links formed in various integrated circuit layers. FIG. 6 can correspond to the arrangement of FIG. 5. Further, FIG. 6 may include some of the same general constituents as FIG. 4. To that extent like items will be referred to the same reference character as FIG. 4.

FIG. 6 shows links arranged in the same general fashion as FIG. 4. However, unlike FIG. 4, a second link 502-3 may include conductive lines 602-30 and 602-31 at a different orientation than in a previous mask version. For example, in FIG. 2, which may represent another mask version, a link 102-2 may include conductive lines 102-20 and 102-21 oriented in a first direction (horizontal in the figure). In contrast, in FIG. 6, a two links 402-2 and 502-3 may include conductive lines 602-20 and 602-21 oriented in a second direction (vertical in the figure).

It is noted that in the example of FIGS. 2, 4 and 6, while conductive lines 402-20 and 402-21 may have a different orientation than a previously mask version, corresponding downward contact holes 204-20/21 and upward contact holes 206-20/21 may have the same general arrangement in all mask versions.

From the above description, it is understood that multiple mask ID bit circuits, such as those illustrated in FIGS. 1–6, can represent more possible mask versions than conventional cases. More particularly, n mask ID bit circuits may represent $2^n$ possible mask versions with any combination of mask layer changes. As but one example, multiple mask ID bit circuits may have an arrangement such as that shown in FIG. 7.

It is understood that that the examples of FIGS. 1–6 represent but one possible progression of mask versions. That is, while FIGS. 1 and 2 show all links (102-0 to 102-4) and conductive lines (202-00 to 202-41) in the same configuration (e.g., all switches in a "down" position and all lines horizontal), such an arrangement does not necessarily have to represent an initial mask version. An initial mask version may have such links and conductive lines in an arbitrary configuration, with changes being made to such links to indicate a different mask version/revision.

It is also noted that the various examples of FIGS. 2, 4 and 6 show links directly on top of one another. Such an arrangement can provide for a mask ID bit circuit that consumes a small amount of circuit area. However, such a configuration should not be construed as limiting the invention thereto. Conductive lines could take different forms, being longer, being shorter, or having bends or the like, to name but a few variations.

Accordingly, it is understood that while various embodiments have been described in detail, the present invention could be subject various changes, substitutions, and alterations without departing from the spirit and scope of the invention. Accordingly, the present invention is intended to be limited only as defined by the appended claims.

What is claimed is:

1. A mask identification circuit, comprising:
a plurality of links arranged in series, each link having at least two inputs and at least two outputs, the inputs being directly coupled to the outputs in a first configuration, the inputs being cross coupled to the outputs in a second configuration.

2. The mask identification circuit of claim 1, wherein:
each link includes at least two conductive lines, the two conductive lines of a link having a first orientation in the first configuration and a second orientation in the second configuration.

3. The mask identification circuit of claim 2, wherein:
the two conductive lines of at least one link are parallel to one another in the first and second configuration.

4. The mask identification circuit of claim 1, wherein:
each link is formed on a different integrated circuit layer.

5. The mask identification circuit of claim 1, wherein:
at least one link includes a first conductive line and a second conductive line, each conductive line having a downward contact to a link formed on a lower integrated circuit layer and an upward contact to a link formed on a higher integrated circuit layer.

6. The mask identification circuit of claim 5, wherein:
the upward contacts are diagonal to one another.

7. The mask identification circuit of claim 5, wherein:
the downward contacts are diagonal to one another.

8. A mask identification code circuit, comprising:
n mask identification (ID) bit circuits that each provide one bit of a mask identification code, where n is an integer greater than 1, and the mask ID bit circuits are configurable to provide more than n different mask identification codes.

9. The mask identification code circuit of claim 8, wherein:
each mask ID bit circuit includes a sense node that is coupled to one of at least two different potentials by at least two signal paths.

10. The mask identification code circuit of claim 8, wherein:
each mask ID bit circuit includes a sense node that is coupled to a first potential to identify one mask, to a second potential to identify a second mask and to the first potential to identify a third mask.

11. The mask identification code circuit of claim 8, wherein:
each mask ID bit circuit includes a plurality of separate signal paths cross coupled with one another to identify different masks.

12. The mask identification code circuit of claim 8, wherein:
each mask identification circuit includes a plurality of links, each link being formed on a different integrated circuit layer.

13. The mask identification code circuit of claim 12, wherein:
each link of a mask identification circuit switches a potential supplied to a sense node when switched between configurations, each link including two conductive lines that are each coupled to a next link toward the sense node by only one contact in both a first and second configuration.

14. The mask identification code circuit of claim 8, wherein:
the mask ID bit circuits configurable to provide $2^n$ different mask identification codes with any combination of mask layer revisions.

15. A method for identifying integrated circuit masks, comprising the steps of:
forming mask bit identification (ID) circuits having interconnected links on a plurality of integrated circuit layers that provide a signal path to a sense node, each link being switchable between at least two configurations; and
switching more than one link of a mask bit ID circuit from one configuration to another to represent multiple mask changes.

16. The method of claim 15, wherein:
forming interconnected links includes forming two conductive lines for each link, each conductive line having an upward contact and a downward contact, the upward contacts of the two conductive lines being essentially diagonal to one another, the downward contacts of the two conductive lines being essentially diagonal to one another.

17. The method of claim 15, wherein:
switching a link from one configuration to another includes changing orientation of two conductive lines of the link.

18. The method of claim 17, wherein:

changing the orientation of the two conductive lines includes placing the two conductive lines essentially perpendicular to a previous orientation.

19. The method of claim 15, wherein:

switching more than one link of a mask ID bit circuit includes switching the configuration of one link for one mask change and switching the configuration of a different link of a same mask ID bit circuit for another mask change.

20. The method of claim 15, wherein:

the links include one link comprising a polysilicon layer and another link comprising an interconnect layer formed over the polysilicon layer.

21. A mask revision identification (ID) code circuit, comprising:

means for cross coupling at least two signal lines according to changes in at least two integrated circuit masks to generate a mask ID code bit.

* * * * *